United States Patent
Furukawa et al.

(10) Patent No.: US 7,315,455 B2
(45) Date of Patent: Jan. 1, 2008

(54) SURFACE-MOUNTED ELECTRONIC COMPONENT MODULE AND METHOD FOR MANUFACTURING THE SAME

(75) Inventors: Osamu Furukawa, Yokohama (JP); Toshihiko Murata, Yokohama (JP); Osamu Ikata, Yokohama (JP)

(73) Assignee: Fujitsu Media Devices Ltd., Yokohama (JP)

( * ) Notice: Subject to any disclaimer, the term of this patent is extended or adjusted under 35 U.S.C. 154(b) by 130 days.

(21) Appl. No.: 10/615,298

(22) Filed: Jul. 9, 2003

(65) Prior Publication Data

US 2004/0042186 A1    Mar. 4, 2004

(30) Foreign Application Priority Data

Aug. 29, 2002    (JP)    ............................. 2002-251257

(51) Int. Cl.
*H05K 7/00* (2006.01)

(52) U.S. Cl. ...................... 361/760; 361/728; 361/748; 361/749; 361/761; 361/763; 361/764; 361/765; 361/767; 361/783; 257/723; 257/724; 257/725

(58) Field of Classification Search ................. 361/760
See application file for complete search history.

(56) References Cited

U.S. PATENT DOCUMENTS

| | | | |
|---|---|---|---|
| 5,999,065 A | | 12/1999 | Furutani et al. |
| 6,057,954 A | * | 5/2000 | Parayanthal et al. ......... 359/248 |
| 6,404,303 B1 | * | 6/2002 | Kuroda ....................... 333/193 |
| 6,424,541 B1 | * | 7/2002 | Fazelpour ................... 361/760 |
| 6,633,005 B2 | * | 10/2003 | Ichitsubo et al. ............ 174/260 |
| 6,713,375 B2 | * | 3/2004 | Shenoy ........................ 438/612 |
| 6,777,819 B2 | * | 8/2004 | Huang ......................... 257/796 |

(Continued)

FOREIGN PATENT DOCUMENTS

JP    05-251980    9/1993

(Continued)

OTHER PUBLICATIONS

Hassan Hashemi et al. "A Mixed Solder Grid Array and Peripheral Leaded MCM Package", *Proceedings of the Electronic Components and Technology Conference* Jun. 1-4, 1993,vol. CONF. 43, New York City.

*Primary Examiner*—Tuan T. Dinh
*Assistant Examiner*—Hoa C Nguyen
(74) *Attorney, Agent, or Firm*—Arent Fox LLP (57) ABSTRACT

More compact, thinner, shorter and lighter surface-mounted electronic component modules and their manufacturing methods at low costs, thus making them industrially highly valuable are available. Such the component includes a wiring substrate having wiring patterns formed on one side and external connection terminals formed on the other side, the wiring patterns and the external connection terminals being connected with each other by via holes or through holes; a plurality of electronic component devices mounted on the one side of the wiring substrate; and an exterior resin layer formed on the wiring substrate which covers the plurality of electronic component devices, wherein at least one of the plurality of electronic component devices is fastened face up to the one side of the wiring substrate, the connection terminal of the electronic component device fastened face up and the wiring pattern or the connection terminal of another electronic component device being connected with each other by wire.

7 Claims, 6 Drawing Sheets

U.S. PATENT DOCUMENTS

| | | | |
|---|---|---|---|
| 6,784,765 B2* | 8/2004 | Yamada et al. | 333/193 |
| 6,794,747 B2* | 9/2004 | Takehara et al. | 257/705 |
| 2001/0006456 A1* | 7/2001 | Fujimoto et al. | 361/760 |
| 2002/0030573 A1 | 3/2002 | Mori et al. | |
| 2002/0097094 A1 | 7/2002 | Wang et al. | |
| 2004/0032706 A1* | 2/2004 | Kemmochi et al. | 361/306.3 |

FOREIGN PATENT DOCUMENTS

| | | |
|---|---|---|
| JP | 09-321088 | 12/1997 |
| JP | 2001352011 A | 12/2001 |
| JP | 2002-118487 | 4/2002 |
| JP | 2002217673 A | 8/2002 |

* cited by examiner

CUT INTO APIECE

TOP VIEW

FIG. 7

BOTTOM VIEW

SURFACE-MOUNTED ELECTRONIC COMPONENT MODULE AND METHOD FOR MANUFACTURING THE SAME

BACKGROUND OF THE INVENTION

1. Field of the Invention

The present invention relates to a surface-mounted electronic component module and a method for manufacturing the same. More particularly, the invention relates to a surface-mounted electronic component module suited to front ends of radio equipment such as cellular phones.

2. Description of the Related Art

Cellular phones and other equipment for mobile communication are becoming increasingly compact and lightweight. This leads to demands for more compact, shorter and lighter electronic components. Methods which meet such demands and by which mounting area is reduced by flip-chip connection of electronic component devices to a wiring substrate are publicly known (for example, see FIG. 8 in Japanese Patent Application Laid-open (kokai) Pub. No. 2002-118487.

However, mounting to a wiring substrate by flip-chip connection alone has, above all, presented the problem that inductance required for high-frequency circuit configuration cannot be obtained.

In this case, known methods are either mounting new chip discrete passive components such as inductors and capacitors to the wiring substrate or using a wiring substrate incorporating capacitors and inductors such as multilayer ceramic or low-temperature fired multilayer ceramic capacitors and inductors and mounting electronic component devices such as semiconductor components and surface acoustic wave filters atop that wiring substrate, for example, see Japanese Patent Application Laid-open (kokai) Pub. No. 2001-211097.

However, the former configuration runs counter to the demand for reduced mounting area. The latter, meanwhile, requires use of multilayer ceramic wiring substrate and the like as discussed above.

This results in thicker wiring substrate and further causes a detrimental effect, that is, increased weight of the wiring substrate itself.

On the other hand, wiring patterns are formed on a wiring substrate to which electronic component devices are mounted, and mounting positions of electronic component devices are determined accordingly. In such a case, mounting positions of electronic component devices are fixed, thus resulting in reduced freedom in system design.

SUMMARY OF THE INVENTION

The present invention was conceived in view of the above deficiencies. It is therefore the object of the present invention to provide a surface-mounted electronic component module, incorporating required inductance devices, capable of reducing the size, the height and the mass and ensuring greater freedom in mounting positions of electronic component devices onto the wiring substrate, and a method for manufacturing such a surface-mounted electronic component module.

In order to achieve the above object, according to a first aspect of the present invention there is provided a surface-mounted electronic component module comprising a wiring substrate having wiring patterns formed on one side and external connection terminals formed on the other side, the wiring patterns and the external connection terminals being connected with each other by via holes or through holes; a plurality of electronic component devices mounted on the one side of the wiring substrate; and an exterior resin layer formed on the wiring substrate which covers the plurality of electronic component devices, wherein at least one of the plurality of electronic component devices is fastened face up to the one side of the wiring substrate, the connection terminal of the electronic component device fastened face up and the wiring pattern or the connection terminal of another electronic component device being connected with each other by wire.

Preferably, at least one of the wires connecting the connection terminal of the electronic component device fastened face up and the wiring pattern or the connection terminal of the another electronic component device, has a predetermined inductance as a circuit element.

Preferably, the electronic component device fastened face up to the one side of the wiring substrate is fastened to the wiring substrate by a bond made of conductive paste.

To achieve the above object, according to a second aspect of the present invention there is provided a surface-mounted electronic component module comprising a wiring substrate having wiring patterns formed on one side and external connection terminals formed on the other side, the wiring patterns and the external connection terminals being connected with each other by via holes or through holes; a semiconductor chip mounted on the one side of the wiring substrate, the semiconductor chip forming a switch for changing over the opening/closing of radio frequency transmission/reception signals and a decoder circuit for controlling the switch changeover operations; a surface acoustic wave filter connected to the switch; and an exterior resin layer formed on the wiring substrate which covers the semiconductor chip and the surface acoustic wave filter, wherein at least one of the semiconductor chip and the surface acoustic wave filter is fastened face up to the one side of the wiring substrate, the connection terminal of the at least one of the semiconductor chip and the surface acoustic wave filter, fastened face up, and the wiring pattern or the connection terminal of the other being connected with each other through wire bonding.

Preferably, connection terminals connected through the wire bonding are signal terminals, the wire bonding having a predetermined inductance as a circuit element.

Preferably, at least one of the semiconductor chip and the surface acoustic wave filter, fastened to the one side of the wiring substrate, is fastened to the wiring substrate by a bond made of conductive paste.

To achieve the above object, according to a third aspect of the present invention there is provided a method for manufacturing a surface-mounted electronic component module comprising the steps of providing a wiring substrate having wiring patterns formed on one side and external connection terminals formed on the other side, the wiring patterns on the one side and the external connection terminals on the other side being connected with each other by via holes or through holes; providing a semiconductor chip having connection terminals disposed on at least the same surface; providing a surface acoustic wave filter having connection terminals disposed on at least the same surface, the surface acoustic wave filter having a closed gap immediately above the portion where a transducer is formed; fastening both or at least one of the semiconductor chip and the surface acoustic wave filter to the wiring pattern surface of the wiring substrate such that the connection terminal does not face the wiring pattern surface; making by wire at least one of three connections, connection between the connection terminal of the semiconductor chip and the wiring pattern of the wiring substrate, connection between the connection terminal of the surface acoustic wave filter and the wiring pattern of the wiring substrate, and connection between the connection terminal of the semiconductor chip and the connection terminal of the surface acoustic wave filter; and coating the wiring substrate with exterior resin in such a manner as to cover the semiconductor chip and the surface acoustic wave filter fastened to the wiring substrate.

BRIEF DESCRIPTION OF THE DRAWINGS

The above and other objects, aspects, features and advantages of the present invention will become more apparent from the following detailed description when taken in conjunction with the accompanying drawings, in which.

DESCRIPTION OF THE PREFERRED EMBODIMENTS

Embodiments of the present invention will now be described with reference to the drawings.

First Embodiment

Figure 1:
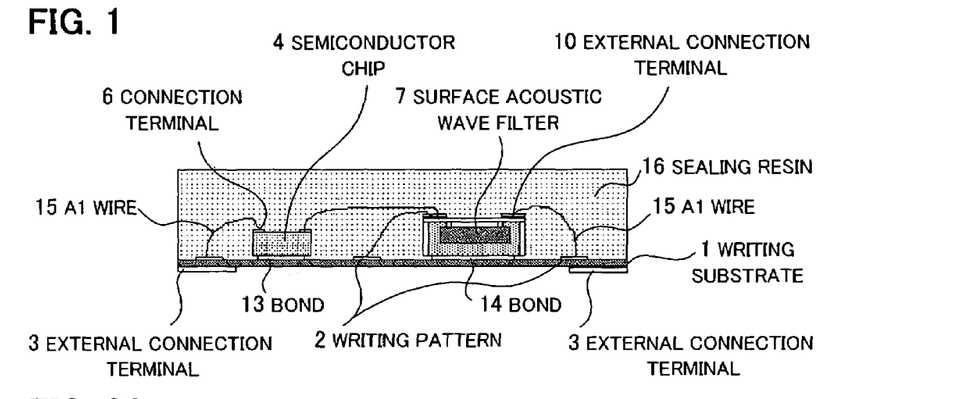
FIG. 1 is a schematic cross-sectional view according to a first embodiment of a surface-mounted electronic component module of the present invention.

FIG. 1 illustrates a schematic cross-sectional view associated with the first embodiment of the surface-mounted electronic component module of the present invention. Meanwhile, FIGS. 2A to 2F illustrate explanatory diagrams of the manufacturing method for the surface-mounted electronic component module. Note that since manufacturing of the module is carried out using manufacturing processes similar to those in FIGS. 2A to 2F also for the structures of other embodiments, only the first embodiment in FIG. 1 is described below by referring to FIGS. 2A to 2F.

In FIGS. 2A to 2F, a wiring substrate made of 0.2 mm-thick bismaleimide triazine resin (BT resin) having both surfaces coated with copper foil is made available, and wiring patterns 2 were formed by forming necessary patterns on one of its surfaces through etching and nickel- and gold-plating conductors. Next, external connection terminals 3 were formed on the other surface (FIG. 2A) for use as a wiring substrate 1. Then the wiring patterns 2 and the external connection terminals 3 were electrically connected by unillustrated via holes formed on the wiring substrate 1.

Figures 2A, 2B:
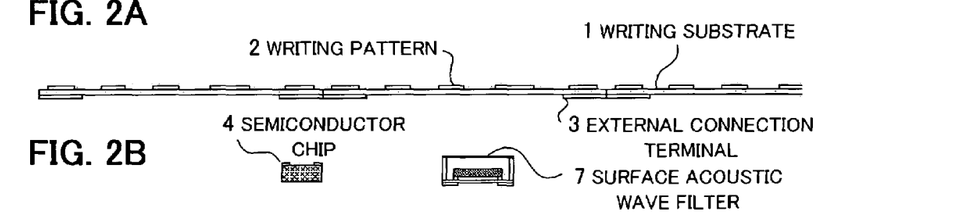
FIGS. 2A to 2F are explanatory diagrams of the manufacturing processes for the surface-mounted electronic component module.
Figure 2C:
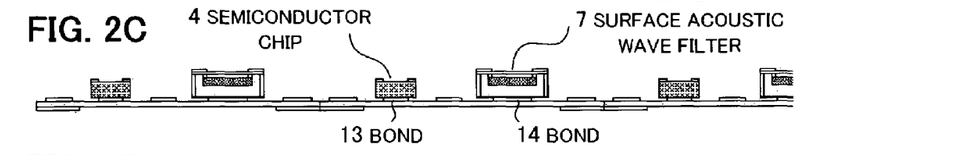
Figure 3:
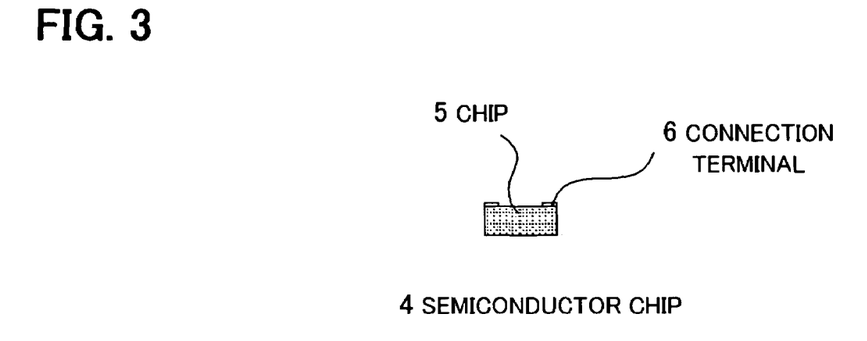
FIG. 3 is a schematic cross-sectional view of a semiconductor chip.

On the other hand, a semiconductor chip 4 and a surface acoustic wave filter 7 were made available as electronic component devices (FIG. 2B). A high-frequency switch, decoder or other functions are added in advance to the semiconductor chip 4 through semiconductor process. Note that a plurality of connection terminals 6 are provided one flat surface of the semiconductor chip 4 for connection to external equipment as shown in FIG. 3. In this case, the pads of the connection terminals 6 are preferably square or rectangular and 100 μm to 150 μm in size.

Note that not only Si, but also GaAs may be used as a wafer substrate for the semiconductor chip 4. Note also that a plurality of devices of different types may be made available for use as the semiconductor chip 4, for example, GaAs device with only switching function or Si device with only decoder function.

Figure 4:
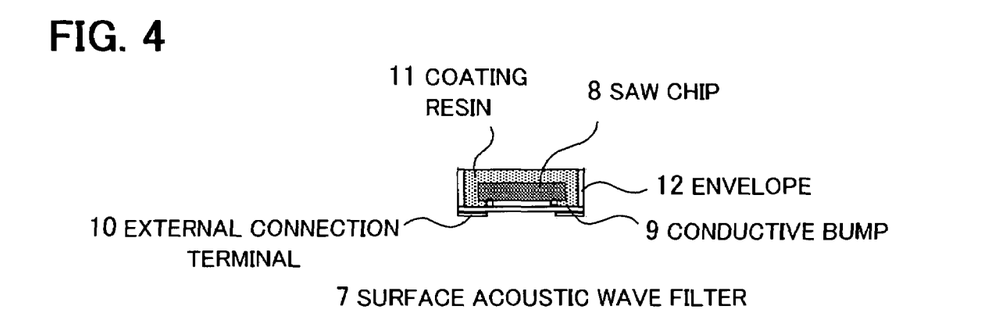
FIG. 4 is a schematic cross-sectional view of a surface acoustic wave filter.

The surface acoustic wave filter 7 has a connection conductive bump 9 formed on the same surface as that on which the surface acoustic wave filter chip's transducer is formed, as shown in FIG. 4. This bump 9 is, for example, an Au bump, solder bump and the like.

The bump diameter is preferably about 40 to 100 μm. An external connection terminal 10 is formed on the main surface on the other side of the ceramic package's die-attach surface while necessary wiring patterns are formed on the die-attach surface.

An SAW chip 8 for surface acoustic wave filter is connected by flip-chip bonding to the ceramic package's die-attach surface on which wiring patterns are formed, and the chip is coated with a coating resin 11 such that the other surface of the chip is covered. Further, an envelope 12 is formed as necessary.

The external connection terminal 10 is formed on the same surface on the surface acoustic wave filter 7 thus obtained. Note that the surface on the other side of this surface is at least partially coated with resin. The surface of the external connection terminal 10 is preferably gold-plated by at least about 0.5 μm.

Referring back to FIGS. 2A to 2F, the semiconductor chip 4 and the surface acoustic wave filter 7, as those shown in FIGS. 3 and 4, are fastened to the wiring substrate 1, on which the wiring patterns 2 and the external connection terminal 3 are formed, approximately every 5 mm×5 mm—a size into which the wiring substrate will be cut later—such that the semiconductor chip 4 and the surface acoustic wave filter 7 do not face the wiring patterns (FIG. 2C).

That is, the semiconductor chip 4 and the surface acoustic wave filter 7 are fastened to the wiring substrate 1 with the connection terminals 6 and 10 (FIGS. 3 and 4) face up. In this case, conductive bond made of silver paste or insulating bond made of silicon or other resin, for example, is used as bonds 13 and 14. Either conductive or insulating bond can be selected as desired for use as the bonds 13 and 14; however, conductive bond such as silver paste is preferable to prevent heat accumulation and improve heat radiation under a condition in which the semiconductor chip 4 or the surface acoustic wave filter 7 generates heat. This condition holds true for semiconductor switch opening and closing large-power signals and the like.

Next, the surface acoustic wave filter 7 is fastened to the wiring pattern surface of the wiring substrate 1 such that the connection terminal 10 does not face the wiring pattern surface. That is, the surface acoustic wave filter 7 is fastened to the wiring substrate 1 with the connection terminal 10 face up. In this case, the surface to which the wiring substrate 1 is fastened is the resin-coated surface.

In this case, note also that conductive bond made of silver paste or insulating bond made of silicon or other resin is used as the bond 14. In this case, either conductive or insulating bond can also be selected as desired for use as the bond 14; however, conductive bond such as silver paste is preferable to improve heat radiation under a condition in which the semiconductor chip, the surface acoustic wave filter or the like generates heat.

Figure 2D:
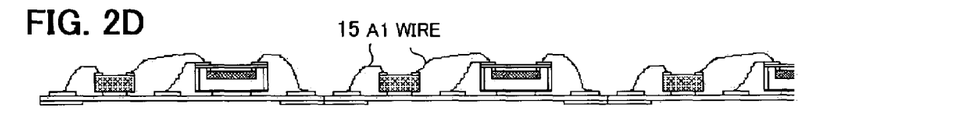

Next, at least one of the connections—between the connection terminal 6 of the semiconductor chip 4 and the wiring pattern 2 of the wiring substrate 1, between the connection terminal 10 of the surface acoustic wave filter 7 and the wiring pattern 2 of the wiring substrate 1, between the connection terminal 6 of the semiconductor chip 4 and the connection terminal 10 of the surface acoustic wave filter 7—is made by wire through wire bonding (FIG. 2D).

In this case, aluminum or gold wire of approximately 30 µm in diameter, for example, can be used as a wire 15.

Figure 2E:
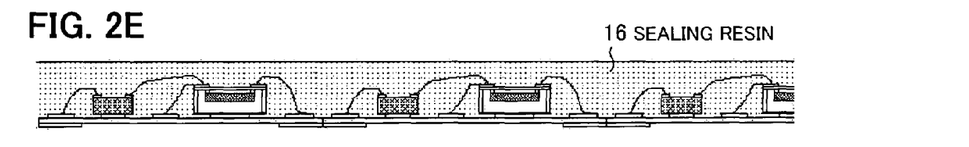
Figure 2F:
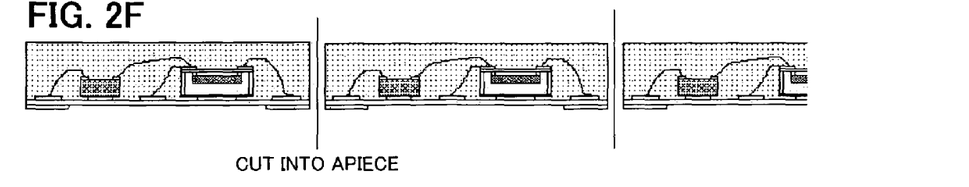

Further, the wiring substrate 1 is coated with a sealing resin 16 such that the semiconductor chip 4 and the surface acoustic wave filter 7 are covered, thus forming an exterior resin layer (FIG. 2E). Polyamide, epoxy and polyolefin resins are among the resin used in this case. Some degree of fluidity is required. Although resin selection and condition adjustments for preventing deformation of the wire 15 are needed, the resin used for ordinary semiconductor device mold and its processes can provide sufficient sealing.

That is, since a gap is secured immediately above the transducer portion by employing pre-resin-sealed components as the surface acoustic wave filter 7 as described in FIG. 4, the sealing resin 16 makes possible resin molding of those including the semiconductor chip 4 and the surface acoustic wave filter 7, thus providing further improved sealing capability as electronic component module.

Here, the component devices fastened to the wiring substrate 1 such that their connection terminals do not face the wiring substrate 1's wiring pattern surface may be both of the semiconductor chip 4 and the surface acoustic wave filter 7 or at least either of the two. If either of the two is fastened, connection terminals other than those connected by wires through wire bonding can be connected, for example, through flip-chip bonding.

Following the formation as discussed above, the wiring substrate is cut into 5 mm×5 mm in size apiece by a dicing saw as the embodiment (FIG. 2F), thus providing individual surface-mounted electronic component modules as shown in FIG. 1.

The surface-mounted electronic component module manufactured according to the present invention discussed above features possible thickness and height reductions. For example, a 1.5 mm-thick surface-mounted electronic component module can be obtained when a 0.1 mm-thick resin wiring substrate is used as the wiring substrate 1 and when the semiconductor chip 4 and the surface acoustic wave filter 7 are made 0.25 mm- and 0.6 mm-thick respectively.

A resin wiring substrate can be used as the wiring substrate 1 in place of a ceramic wiring substrate employed for conventional electronic component modules. Wire bonding can provide electronic component modules with excellent connection reliability as its wires are able to accommodate warping to wiring caused by thermal expansion and contraction.

Further, weight reduction is possible. That is, weight can be reduced since the proportion of resin-sealed portion in this wiring substrate is large as compared with conventional ceramic wiring substrate in terms of the proportions of ceramic having larger specific gravity and resin having smaller specific gravity. Moreover, mounting area can be reduced. Flip-chip connection via conductive bumps requires bump pads, at least approximately 100 µm square each, and pad-to-pad distance of approximately 80 µm, thus resulting in approximately 180 µm pitch. This is not preferable as it leads to increase in size of the semiconductor chip 4, thus requiring larger mounting area.

In contrast, wire bonding connection achieves connection of the semiconductor chip 4 with a pitch of approximately 100 µm, allowing size reduction of the chip itself and eventual reduction of the overall mounting area.

Performance of electronic components can be improved. Necessary inductance component can be positively secured by fastening face up the surface acoustic wave filter 7 and the semiconductor chip 4, which are originally flip-chip-connectable, to the wiring substrate 1 and wire-connecting them. That is, the inductance value can be readily determined, for example, by properly determining or changing the positions (layout) of the semiconductor chip 4 and the surface acoustic wave filter 7 and the arrangement of external connection terminals on the wiring substrate 1.

Further, wire connection of signal terminals in particular makes it easier to achieve circuit impedance matching.

Moreover, the wire connection enhances freedom in distance between connections which are made between the wiring patterns 2 of the wiring substrate 1 and the connection terminals of the semiconductor chip 4 and the surface acoustic wave filter 7. Consequently, layout design of the semiconductor chip 4 and the surface acoustic wave filter 7 on the wiring substrate 1 is made easier.

Figure 5:
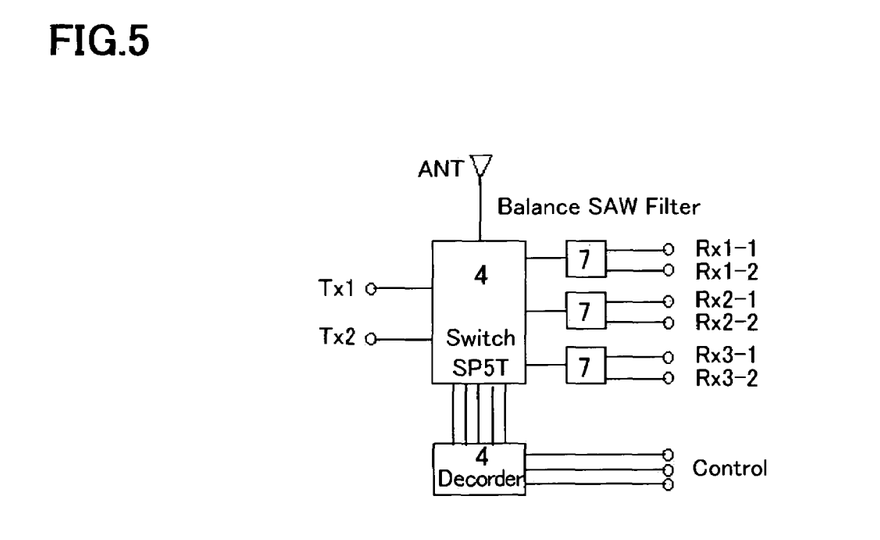
FIG. 5 is a circuit block diagram of a radio frequency signal transmission-reception unit.

Here, the surface-mounted electronic component module shown in FIG. 1 is employed for the radio frequency signal transmission-reception unit shown in FIG. 5. The radio frequency signal transmission-reception unit has the capability of transmitting radio frequency transmission signals, fed by the unillustrated transmission circuit, via the antenna ANT and sending radio frequency reception signals, received by the antenna ANT, to the reception circuit after filtering by a filter having a predetermined passband.

This transmission-reception unit is comprised of an open/close switch for transmission and reception signals, a band-pass filter and a decoder designed to control switching between transmission and reception signals of the signal open/close switch.

And, the semiconductor chip 4 comprises the signal open/close switch and the decoder while the surface acoustic wave filter 7 comprises the band-pass filter, as an embodiment of the present invention.

Figure 6:
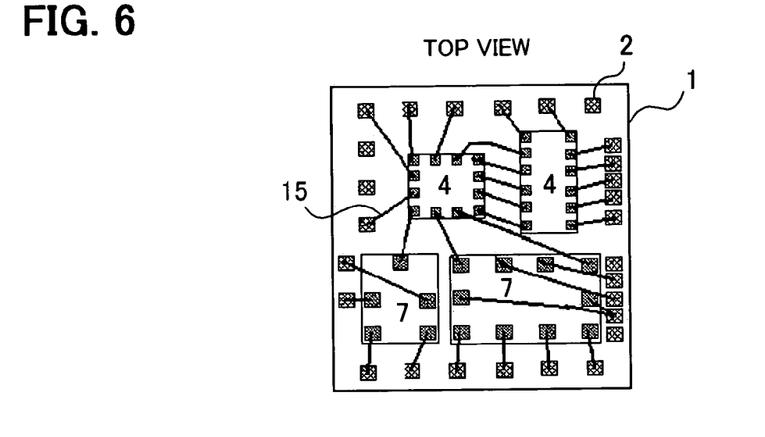
FIG. 6 is a schematic diagram of a wiring substrate prior to coating with the sealing resin, with the surface acoustic wave filters and the semiconductor chips mounted and connected by the wires through wire bonding.
Figure 7:
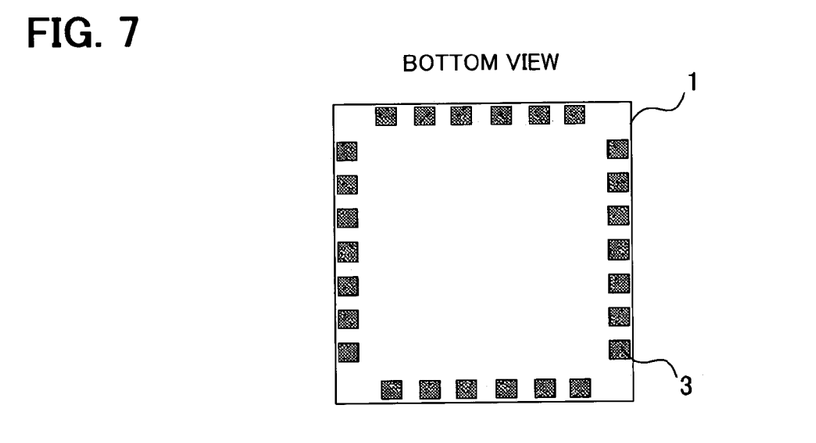
FIG. 7 is a schematic diagram of the surface on which are formed the external connection terminals of the wiring substrate.

FIGS. 6 and 7 illustrate the arrangement of the semiconductor chip 4, the surface acoustic wave filter 7, the wiring patterns 2 and the connection terminals 3 of the surface-mounted electronic component module of the radio frequency signal transmission-reception unit, shown in FIG. 5, manufactured by the processes shown in FIGS. 2A to 2F; FIG. 6 illustrates a schematic diagram of the wiring substrate 1 prior to coating with the sealing resin 16, with the surface acoustic wave filters 7 and the semiconductor chips 4 mounted and connected by the wires 15 through wire bonding. FIG. 7 illustrates a schematic diagram of the surface on which the external connection terminals 3 of the wiring substrate 1 are formed.

In the example shown in FIG. 6, the two semiconductor chips 4, one comprising the signal open/close switch and the other the decoder for the radio frequency signal transmission-reception unit shown in FIG. 5 and the two surface acoustic wave filters 7 comprising the reception band-pass filters are provided on the wiring substrate 1 with their connection terminals face up.

Here, the size of the semiconductor chip 4 serving as the signal open/close switch was approximately 1.4×1.0×0.25 mm while that of the semiconductor chip 4 serving as the decoder was approximately 1.5×1.0×0.25 mm; the sizes of the surface acoustic wave filters 7 were 2.0×1.6×0.6 mm and 2.5×2.0×0.6 mm.

The connection terminals of the semiconductor chips 4 and the surface acoustic wave filters 7 are connected to the wiring pattern 2 by the wires 15 as shown in FIG. 6. Consequently, arrangement layout constraints of the semiconductor chips 4 and the surface acoustic wave filters 7 can be relieved.

Further, the semiconductor chips 4 and the surface acoustic wave filters 7 fastened to the wiring substrate 1 are coated with the resin 16 such that they are covered. Polyamide, epoxy and polyolefin resins are among those which can be used as the resin in this case. Some degree of fluidity is required. Although resin selection and condition adjustments for preventing deformation of the wires 15 are needed, the resin used for ordinary semiconductor mold and its processes can provide sufficient sealing. Thus, an electronic component module having outer dimensions of approximately 5×5×1.5 mm was obtained.

Figure 8:
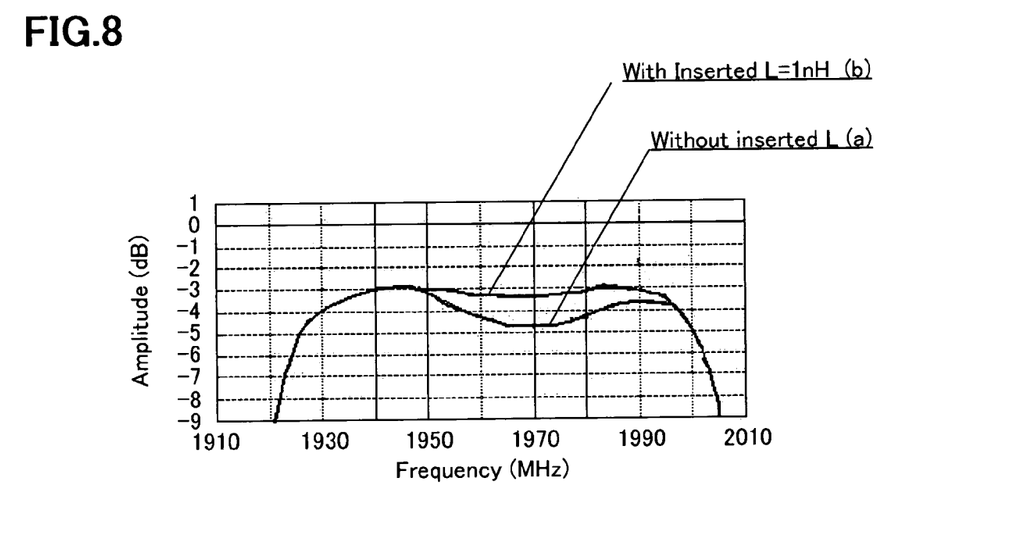
FIG. 8 illustrates an example of the band characteristic of the surface acoustic wave filters.

Here, one example of the band characteristic of the surface acoustic wave filters 7 is shown in FIG. 8. The surface acoustic wave filters 7's band characteristic contains a ripple in the band which represents attenuation in a specific frequency region (FIG. 8a). It means that the band characteristic is narrowed by this ripple. To solve this problem, a proper inductance L is inserted at the input or output side of the surface acoustic wave filters 7 as shown in FIG. 9.

Figure 9:
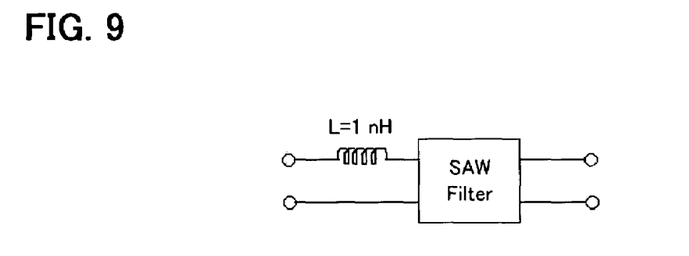
FIG. 9 is a block diagram of the configuration for eliminating ripples in the band characteristic of the surface acoustic wave filters.

In the example shown in FIG. 9, the inductance L of 1 nH is inserted at the input side. This has eliminated the ripple present in FIG. 8a, as shown in FIG. 8b.

Although the surface acoustic wave filter 7 shown in FIG. 4 is originally intended to be mounted face down if mounted discretely, it is mounted face up with its terminals connected through wire bonding. This provides sufficient hermeticity required of the surface acoustic wave filter 7.

Figure 10:
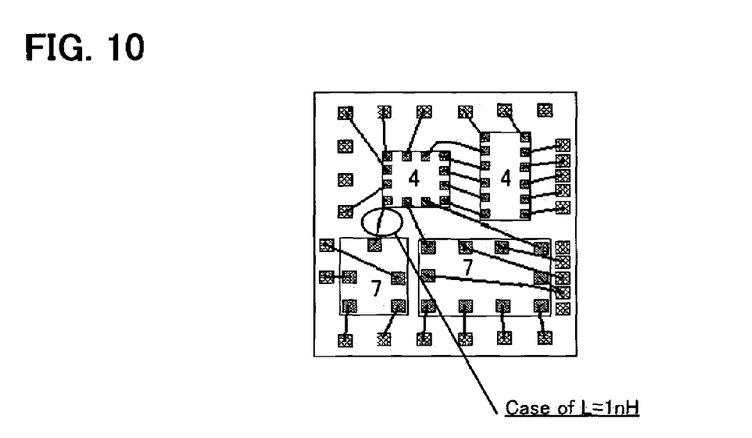
FIG. 10 is an explanatory diagram of the wire connection in FIG. 6 for realizing the block diagram in FIG. 9.

At the same time, inductance component of the aluminum wire 15 was found to be 1 nH per millimeter (mm). In FIG. 10 as in FIG. 6, therefore, the inductance required to eliminate ripples can be positively formed by making the aluminum wire 15, represented by "0" which connects the input terminal of the surface acoustic wave filter 7 to the output terminal of the semiconductor chip 4, approximately one millimeter (mm) long.

Thus, an electronic component module having outer dimensions of approximately 5×5×1.5 mm and 12 signal terminals was obtained.

Second Embodiment

Figure 11:
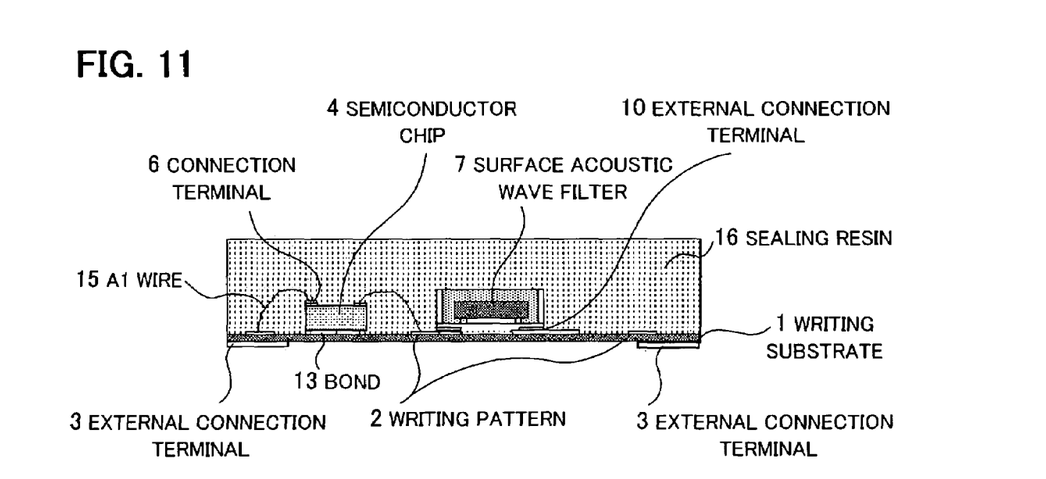
FIG. 11 is a schematic cross-sectional view according to a second embodiment of the surface-mounted electronic component module of the present invention.

FIG. 11 illustrates a schematic cross-sectional view associated with the second embodiment of the surface-mounted electronic component module of the present invention. As with the embodiment shown in FIG. 1, the wiring substrate 1, the semiconductor chip 4 and the surface acoustic wave filter 7 were made available.

Next, the semiconductor chip 4 was fastened to the wiring pattern surface 2 of the wiring substrate 1 using the bond 13 such that the connection terminal 6 did not face the wiring pattern surface 2 of the wiring substrate 1. That is, the semiconductor chip 4 was fastened to the wiring substrate 1 with the connection terminal 6 face up. In this case, conductive bond made of silver paste was used as the bond 13. Conductive bond such as silver paste is preferable to prevent heat accumulation and improve heat radiation under a condition in which the semiconductor chip 4 such as semiconductor switch for opening/closing large-power signal or the surface acoustic wave filter 7 generates heat.

Next, the surface acoustic wave filter 7 was fastened to the wiring pattern surface 2 of the wiring substrate 1 such that the connection terminal 10 faced the wiring pattern surface 2 of the wiring substrate 1. That is, the connection terminal 10 was fastened face down to either of the wiring patterns 2 on the wiring substrate 1. In this case, unillustrated solder was used for bonding. Conductive bond offers the same effect if used in place of solder.

Next, the connection terminal 6 of the semiconductor chip 4 was connected to the wiring pattern 2 of the wiring substrate 1 through wire bonding. In this case, an aluminum wire of 30 μm in diameter was used as the wire 15. Note that the connection terminal 10 of the surface acoustic wave filter 7 was electrically connected to the wiring pattern of the wiring substrate 1 by solder.

The wire between the wiring pattern 2 of the wiring substrate 1 connected to the connection terminal 10 of the surface acoustic wave filter 7 and the connection terminal 6 of the semiconductor chip 4 provides inductance required to eliminate ripples in the band discussed earlier. The inductance value can be readily determined, for example, by properly determining or changing the positions (layout) of the semiconductor chip 4 and the surface acoustic wave filter 7 and the arrangement of the wiring patterns 2 on the wiring substrate 1.

Further, the semiconductor chip 4 and the surface acoustic wave filter 7 fastened to the wiring substrate 1 were coated with the epoxy resin 16 such that they were covered. Polyamide, epoxy and polyolefin resins are among those which can be used as the resin in this case. Some degree of fluidity is required. Although resin selection and condition adjustments for preventing deformation of the wires 15 are needed, the resin used for ordinary semiconductor mold and its processes can provide sufficient sealing.

Thus, an electronic component module having outer dimensions of approximately 5×5×1.5 mm and 12 signal terminals has been obtained.

Third Embodiment

Figure 12:
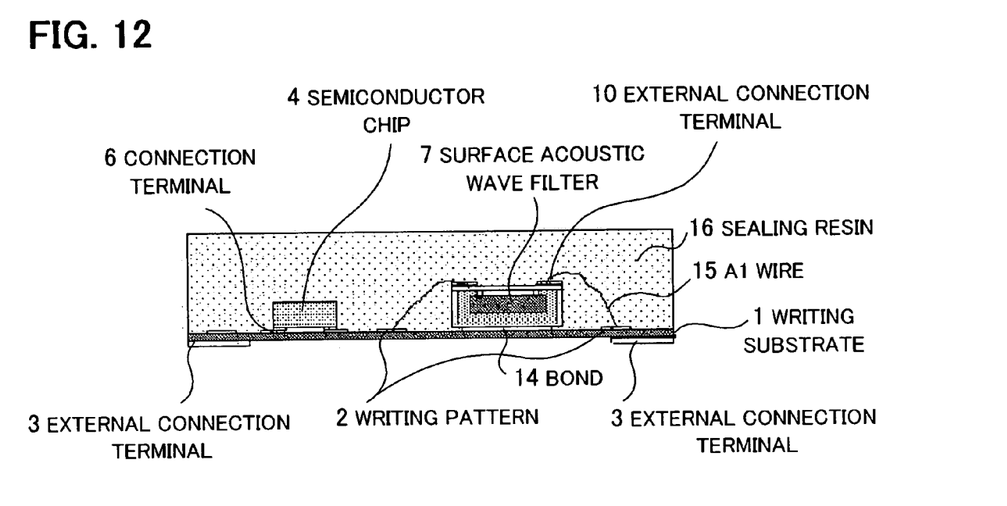
FIG. 12 is a schematic cross-sectional view representing a third embodiment of the surface-mounted electronic component module of the present invention.

FIG. 12 illustrates a schematic cross-sectional view associated with the third embodiment of the surface-mounted electronic component module of the present invention, in which wires are used for connection of the surface acoustic wave filter 7's side.

As with the first and second embodiments, the wiring substrate 1, the semiconductor chip 4 and the surface acoustic wave filter 7 were made available. Next, the semiconductor chip 4 was fastened to the wiring pattern surface 2 of the wiring substrate 1 using the bond 13 such that the connection terminal 6 faced the wiring pattern surface 2 of the wiring substrate 1. That is, the semiconductor chip 4 was fastened to the wiring substrate 1 with the connection terminal 6 face down. In this case, an unillustrated Au bump was formed on the connection terminal 6 in advance and then flip-chip-connected to part of the wiring pattern 2 area of the wiring substrate 1.

Next, the surface acoustic wave filter 7 was fastened to the wiring pattern surface 2 of the wiring substrate 1 such that the connection terminal 10 did not face the wiring pattern surface of the wiring substrate 1. That is, the surface acoustic wave filter 7 is fastened to the wiring substrate 1 with the connection terminal 10 face up. In this case, the surface to which the wiring substrate 1 was fastened is the surface coated with the resin 11. Note also that in this case conductive bond made of silver paste was used as the bond 14. Either conductive or insulating bond can be selected as desired for use as the bond 14; however, conductive bond is preferable to improve heat radiation under a condition in which the semiconductor chip 4 or the surface acoustic wave filter 7 generates heat.

Next, the connection terminal 10 of the surface acoustic wave filter 7 was connected to the wiring pattern 2 of the wiring substrate 1 through wire bonding. In this case, an aluminum wire of 30 μm in diameter was also used as the wire 15.

Note that the connection terminal 6 of the semiconductor chip 4 is electrically connected to the wiring pattern of the wiring substrate 1 using the unillustrated Au bump.

The wire 15 between the connection terminal 10 of the surface acoustic wave filter 7 and the wiring pattern of the wiring substrate 1 provides the necessary inductance value. The inductance value can be readily determined, for example, by properly determining or changing the positions (layout) of the semiconductor chip 4 and the surface acoustic wave filter 7 and the arrangement of the wiring patterns 2 on the wiring substrate 1, as discussed in FIG. 6.

Further, the semiconductor chip 4 and the surface acoustic wave filter 7 fastened to the wiring substrate 1 were coated with the epoxy resin 16 such that they were covered. Polyamide, epoxy and polyolefin resins are among those which can be used as the resin in this case. Some degree of fluidity is required. Although resin selection and condition adjustments for preventing deformation of the wires 15 are needed, the resin used for ordinary semiconductor mold and its processes can provide sufficient sealing.

Thus, an electronic component module having outer dimensions of approximately 5×5×1.5 mm and 12 signal terminals can be obtained.

Fourth Embodiment

The fourth embodiment uses wire bonding for connection on both of the semiconductor chip 4 and the surface acoustic wave filter 7 as with the first embodiment and further incorporates passive components such as multilayer LC filter.

Figure 13:
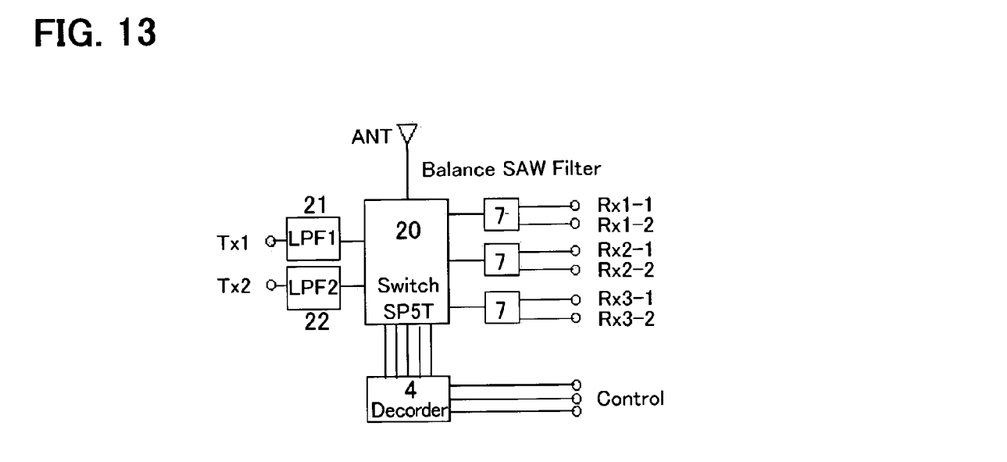
FIG. 13 is a circuit block diagram of the electronic component module of a fourth embodiment.

FIG. 13 illustrates a circuit block diagram of the electronic component module of the fourth embodiment. Low-pass filters (LPFs) 21 and 22 are provided on the transmission input side of a GaAs chip 20 which is a semiconductor switch. The Low-pass filters 21 and 22 are comprised of ceramic chip laminate and have, for example, six terminals of 1.6×0.8×0.6 mm with their connection terminals made of AgPd (silver-paradium) alloy.

In this case, connection of the connection terminals of the low-pass filters 21 and 22 and the wiring patterns 2 of the wiring substrate 1 can be made using solder; however, Al (aluminum) wires are used to connect them through wire bonding.

Thus, an approximately 1.5 mm-thick surface-mounted switch module incorporating low-pass filters can be obtained.

Fifth Embodiment

Although being similar to the fourth embodiment, the fifth embodiment uses filters embedded in the wiring substrate for use as the low-pass filters 21 and 22 in place of ceramic chip laminate. A bismaleimide triazine resin wiring substrate was used as the wiring substrate and comprised of 0.1 mm-thick copper foil double-sided base material and prepreg, with the low-pass filters 21 and 22 of 2×4 mm in area and approximately 0.5 mm in thickness built into the 5×5 mm wiring substrate. The semiconductor chip and the surface acoustic wave filter were mounted on this wiring substrate.

In this case, connection between the connection terminals of the low-pass filters and the wiring patterns was made by Al (aluminum) wires through wire bonding, thus ensuring circuit impedance matching.

Further, sealing was performed by resin, as a result of which an approximately 1.4 mm-thick surface-mounted switch module incorporating low-pass filters can be obtained.

Sixth Embodiment

The sixth embodiment uses wire bonding for connection on both of the semiconductor chip 4 and the surface acoustic wave filter 7 as with the first embodiment but differs from the first embodiment in that it further incorporates passive components such as multilayer LC filter.

Figure 14:
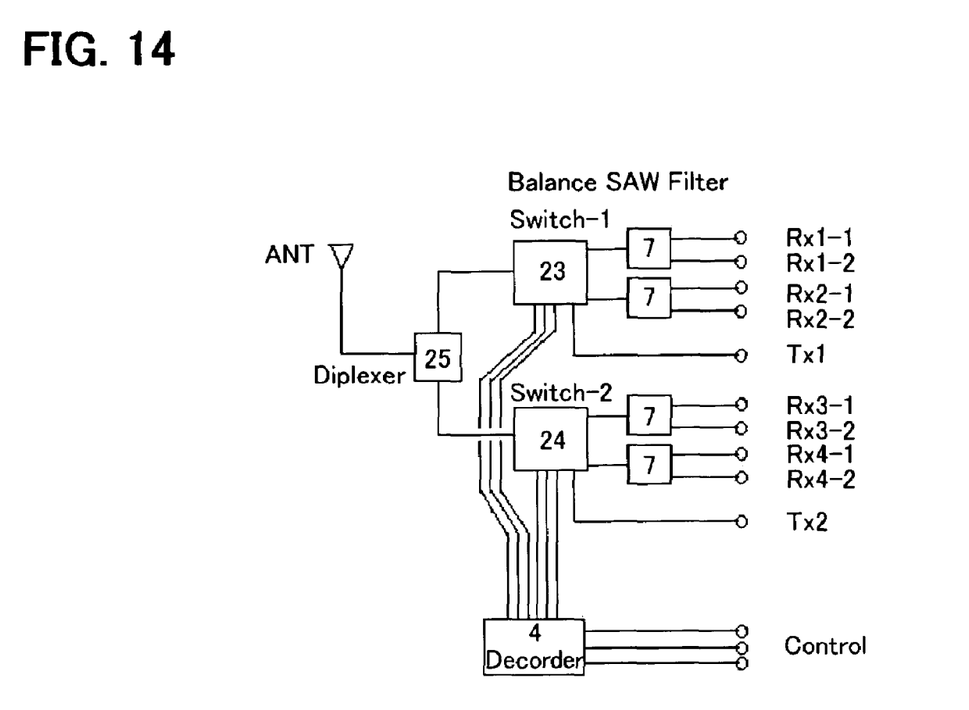
FIG. 14 is a circuit block diagram according to a sixth embodiment of the surface-mounted electronic component module of the present invention.

FIG. 14 illustrates a circuit block diagram of the electronic component module of the sixth embodiment. A diplexer 25 is provided on the ANT sides of GaAs switches 23 and 24 which are semiconductor switches designed to open or close signals. The diplexer 25 is, for example, a ceramic multilayer diplexer and has eight terminals of 2.0×1.25×0.95 mm with their connection terminals made of AgPd (silver-paradium) alloy.

In this case, connection between the diplexer 25 and the semiconductor chips 23 and 24 and the wiring pattern 2 of the wiring substrate 1 was made by Al (aluminum) wires through wire bonding.

Thus, an approximately 1.5 mm-thick surface-mounted transmission-reception circuit switch module incorporating a diplexer can be obtained.

As discussed above, the surface-mounted electronic component module of the present invention and its manufacturing method provide more compact, thinner, shorter and lighter surface-mounted electronic component modules and their manufacturing methods at low costs, thus making them industrially highly valuable.

While illustrative and presently preferred embodiments of the present invention have been described in detail herein, it is to be understood that the inventive concepts may be otherwise variously embodied and employed and that the appended claims are intended to be construed to include such variations except insofar as limited by the prior art.

What is claimed is:

1. A surface-mounted electronic component module comprising:
   a wiring substrate having wiring patterns formed on one side and external connection terminals formed on the other side, the wiring patterns and the external connection terminals being connected with each other via holes or through holes;
   a plurality of electronic component devices mounted on the one side of the wiring substrate,
   wherein the plurality of electronic component devices include a surface acoustic wave filter that is fastened face up to the one side of the wiring substrate, having a connection terminal, and a semiconductor chip that is fastened face down to the one side of the wiring substrate;
   a bonding wire connecting the connection terminal of the surface acoustic wave filter with the semiconductor chip or with one of the wiring patterns formed on the one side of the wiring substrate, the bonding wire having an inductance that eliminates ripples in a frequency band characteristic of the surface acoustic wave filter to which one terminal of the bonding wire is connected; and
   an exterior resin layer formed on the wiring substrate which covers the plurality of electronic component devices, and the bonding wire.

2. The surface-mounted electronic component module according to claim 1, wherein the surface acoustic wave filter fastened face up to the one side of the wiring substrate is fastened to the wiring substrate by a bond made of conductive paste.

3. The module of claim 1, wherein the inductance of the bonding wire is 1 nh/mm.

4. A surface-mounted electronic component module comprising:
   a wiring substrate having wiring patterns formed on one side and external connection terminals formed on the other side, the wiring patterns and the external connection terminals being connected with each other by via holes or through holes;
   a semiconductor chip mounted face up on the one side of the wiring substrate, having a connection terminal, and forming a switch for changing over the opening/closing of radio frequency transmission/reception signals and a decoder circuit for controlling the switch changeover operations;
   a surface acoustic wave filter fastened face up and mounted on the one side of the wiring substrate, and electrically connected to the switch;
   a bonding wire having one terminal connected to the surface acoustic wave filter and the other terminal connected to the connection terminal of the semiconductor chip, the bonding wire having a specific inductance that eliminates ripples in a frequency band characteristic of the surface acoustic wave filter; and
   an exterior resin layer formed on the wiring substrate which covers the semiconductor chip, the surface acoustic wave filter and the bonding wire.

5. The surface-mounted electronic component module according to claim 4, wherein the semiconductor chip mounted face up on the one side of the wiring substrate, is fastened to the wiring substrate by a bond made of conductive paste.

6. The module of claim 4, wherein the inductance of the bonding wire is 1 nh/mm.

7. A surface-mounted electronic component module comprising:
   a wiring substrate having wiring patterns formed on one side and external connection terminals formed on the other side, the wiring patterns and the external connection terminals being connected with each other via holes or through holes;
   a plurality of electronic component devices mounted on the one side of the wiring substrate,
   wherein the plurality of electronic component devices include a surface acoustic wave filter, which is fastened face down to the one side of the wiring substrate, having a connection terminal, and a semiconductor chip, which is fastened face up to the one side of the wiring substrate;
   a bonding wire connecting the connection terminal of the surface acoustic wave filter with the semiconductor chip or with one of the wiring patterns formed on the one side of the wiring substrate, the bonding wire having an inductance that eliminates ripples in a frequency band characteristic of the semiconductor chip, to which one terminal of the bonding wire is connected; and
   an exterior resin layer formed on the wiring substrate which covers the plurality of electronic component devices, and the bonding wire.

* * * * *